United States Patent
Herner

(10) Patent No.: US 7,767,499 B2
(45) Date of Patent: Aug. 3, 2010

(54) METHOD TO FORM UPWARD POINTING P-I-N DIODES HAVING LARGE AND UNIFORM CURRENT

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 73 days.

(21) Appl. No.: 11/692,151

(22) Filed: Mar. 27, 2007

(65) Prior Publication Data
US 2007/0190722 A1  Aug. 16, 2007

Related U.S. Application Data

(63) Continuation-in-part of application No. 10/955,549, filed on Sep. 29, 2004, which is a continuation-in-part of application No. 10/855,784, filed on May 26, 2004, now Pat. No. 6,952,030, which is a continuation of application No. 10/326,470, filed on Dec. 19, 2002, now abandoned.

(51) Int. Cl.
*H01L 21/82* (2006.01)
*H01L 21/336* (2006.01)

(52) U.S. Cl. ............... 438/129; 438/125; 438/128; 438/131; 438/132; 438/237; 438/238; 438/257; 438/258; 438/259; 257/E23.147; 257/E31.029

(58) Field of Classification Search ............ None
See application file for complete search history.

(56) References Cited

U.S. PATENT DOCUMENTS 4,943,538 A * 7/1990 Mohsen et al. ............ 438/215

(Continued)

FOREIGN PATENT DOCUMENTS

WO  WO 2006/039370 A  4/2006

(Continued)

OTHER PUBLICATIONS

Herner, et al., "Vertical p-i-n Polysilicon Diode with Antifuse for Stackable Field-Programmable ROM," IEEE Electron Device Letters, May 2004, pp. 271-273, vol. 25, No. 5.

(Continued)

*Primary Examiner*—Charles D Garber
*Assistant Examiner*—Pape Sene
(74) *Attorney, Agent, or Firm*—Dugan & Dugan, P.C.

(57) ABSTRACT

A method is disclosed to form an upward-pointing p-i-n diode formed of deposited silicon, germanium, or silicon-germanium. The diode has a bottom heavily doped p-type region, a middle intrinsic or lightly doped region, and a top heavily doped n-type region. The top heavily doped p-type region is doped with arsenic, and the semiconductor material of the diode is crystallized in contact with an appropriate silicide, germanide, or silicide-germanide. A large array of such upward-pointing diodes can be formed with excellent uniformity of current across the array when a voltage above the turn-on voltage of the diodes is applied. This diode is advantageously used in a monolithic three dimensional memory array.

21 Claims, 7 Drawing Sheets

U.S. PATENT DOCUMENTS

| | | | |
|---|---|---|---|
| 5,578,850 A * | 11/1996 | Fitch et al. ............... 257/329 | |
| 5,915,167 A | 6/1999 | Leedy | |
| 6,034,882 A * | 3/2000 | Johnson et al. ............ 365/103 | |
| 6,420,215 B1 | 7/2002 | Knall et al. | |
| 6,525,953 B1 * | 2/2003 | Johnson ...................... 365/63 | |
| 6,534,841 B1 * | 3/2003 | Van Brocklin et al. ...... 257/530 | |
| 6,946,719 B2 | 9/2005 | Petti et al. | |
| 6,952,030 B2 | 10/2005 | Herner et al. | |
| 6,952,043 B2 | 10/2005 | Vyvoda et al. | |
| 7,172,840 B2 | 2/2007 | Chen | |
| 7,176,064 B2 | 2/2007 | Herner | |
| 7,575,984 B2 | 8/2009 | Radigan et al. | |
| 2001/0036750 A1 * | 11/2001 | Radens et al. ............... 438/770 | |
| 2005/0052915 A1 | 3/2005 | Herner et al. | |
| 2005/0121742 A1 | 6/2005 | Petti et al. | |
| 2005/0221200 A1 | 10/2005 | Chen | |
| 2005/0226067 A1 | 10/2005 | Herner et al. | |
| 2006/0087005 A1 | 4/2006 | Herner | |
| 2006/0250837 A1 | 11/2006 | Herner et al. | |
| 2006/0289996 A1 | 12/2006 | Ono et al. | |
| 2007/0072360 A1 | 3/2007 | Kumar et al. | |
| 2007/0087508 A1 | 4/2007 | Herner | |
| 2007/0190722 A1 | 8/2007 | Herner | |
| 2008/0237599 A1 | 10/2008 | Herner et al. | |

FOREIGN PATENT DOCUMENTS

| | | |
|---|---|---|
| WO | WO 2006/121837 A | 11/2006 |
| WO | WO 2006/121924 A | 11/2006 |

OTHER PUBLICATIONS

Herner, et al., "Polysilicon Memory Switching: Electrothermal-Induced Order," IEEE Electron Device Letters, Sep. 2006, pp. 2320-2327, vol. 53, No. 9.

Herner, U.S. Appl. No. 11/560,283, filed Nov. 15, 2006, entitled "Method for Making a P-I-N Diode Crystallized Adjacent to a Silicide in Series with a Dielectric Antifuse," not yet published.

Herner, S.B. et al., "Polysilicon Memory Switching: Electrothermal-Induced Order", IEEE Transactions on Electron Devices, vol. 53, No. 9, Sep. 9, 2006, pp. 2320-2327.

Herner et al., "Vertical P-I-N Polysilicon Diode with Antifuse for Stackable Field-Programmable ROM", IEEE Electron Device Letters, IEEE Service Center, New York, NY, vol. 25, No. 5, May 1, 2004 (pp. 271-273).

International Search Report of PCT/US2008/003975 dated Mar. 18, 2009.

Written Opinion of PCT/US2008/003975 dated Mar. 18, 2009.

Office Action of counterpart European Patent Application No. 08 826 319.9 mailed Jan. 18, 2010.

International Preliminary Report on Patentability of International Application No. PCT/US2008/003975 mailed Oct. 8, 2009.

Herner, U.S. Appl. No. 12/478,481, filed Jun. 4, 2009.

May 28, 2010 Reply to Jan. 18, 2010 Office Action of counterpart European Patent Application No. 08 826 319.9.

* cited by examiner

Embodiment of 6,952,030

METHOD TO FORM UPWARD POINTING P-I-N DIODES HAVING LARGE AND UNIFORM CURRENT

RELATED APPLICATIONS

This application is a continuation-in-part of Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application, which is a continuation-in-part of Herner et al., U.S. Pat. No. 6,952,030, "An Improved Method for Making High-Density Nonvolatile Memory," hereinafter the '030 patent; which is a continuation of Herner et al., U.S. patent application Ser. No. 10/326,470, "An Improved Method for Making High-Density Nonvolatile Memory," filed Dec. 19, 2002 (since abandoned) and hereinafter the '470 application, all assigned to the assignee of the present invention and hereby incorporated by reference in their entirety This application is related to Herner, U.S. patent application Ser. No. 11/692,153, Herner et al, U.S. patent application Ser. No. 11/692,144, and Herner et al, U.S. patent application Ser. No. 11/692,148, all filed on Mar. 27, 2007, and hereby incorporated by reference in their entirety.

BACKGROUND OF THE INVENTION

A diode has the characteristic of allowing very little current flow below a certain turn-on voltage, and substantially more current above the turn-on voltage. It has proven difficult to form a large population of vertically oriented p-i-n diodes having a bottom heavily doped p-type region, a middle intrinsic region, and a top heavily doped n-type region with good uniformity of current among the diodes when a voltage above the turn-on voltage is applied.

It would be advantageous to form a large population of such upward-pointing diodes having good uniformity, specifically for use in a memory array.

SUMMARY OF THE PREFERRED EMBODIMENTS

The present invention is defined by the following claims, and nothing in this section should be taken as a limitation on those claims. In general, the invention is directed to a method to fabricate an upward-pointing p-i-n diode.

A first aspect of the invention provides for a method for forming a vertically oriented p-i-n diode, the method comprising: forming a first rail-shaped conductor above a substrate; forming a bottom heavily doped p-type region of deposited semiconductor material above the first rail-shaped conductor; forming a middle intrinsic or lightly doped region of deposited semiconductor material above the bottom heavily doped p-type region of semiconductor material, wherein the deposited semiconductor material is silicon, germanium, or a silicon-germanium alloy; patterning and etching the bottom heavily doped p-type region and the middle intrinsic or lightly doped region to form a pillar; forming a top heavily doped n-type region doped with arsenic; and annealing to crystallize the semiconductor material, where some portion of the semiconductor material was amorphous as deposited and is in contact with a silicide, germanide, or silicide-germanide after the annealing step, wherein the p-i-n diode comprises the bottom heavily doped p-type region, the middle intrinsic or lightly doped region, and the top heavily doped n-type region.

Another aspect of the invention provides for a method for forming a monolithic three dimensional memory array, the method comprising: monolithically forming a first memory level above a substrate by: i) forming a first plurality of rail-shaped conductors above the substrate; ii) forming a bottom heavily doped p-type region of deposited semiconductor material above the first rail-shaped conductors; iii) forming a middle intrinsic or lightly doped region of deposited semiconductor material above the bottom heavily doped p-type semiconductor, wherein the deposited semiconductor material is silicon, germanium, or a silicon-germanium alloy; iv) patterning and etching the bottom heavily doped p-type region and the middle intrinsic or lightly doped region to form a first plurality of pillars; v) forming a top heavily doped region doped with arsenic; vi) annealing to crystallize the semiconductor material, where some portion of the semiconductor material was amorphous as deposited and is in contact with a silicide, germanide, or silicide-germanide after the annealing step; and vii) forming a second plurality of rail-shaped conductors above the middle intrinsic or lightly doped region, wherein the first memory level comprises a first plurality of memory cells, each first memory cell comprising a portion of one of the first rail-shaped conductors, one of a first plurality of pillars, and a portion of one of the second conductors, wherein each of the first pillars comprises a p-i-n diode comprising a bottom heavily doped p-type region, a middle intrinsic or lightly doped region, and a top heavily doped n-type region formed by the doping step, and monolithically forming a second memory level above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

In the '470 application, the '030 patent, and the '549 application, all owned by the assignee of the present invention, memory cells are described, each including a vertically oriented p-i-n diode in the form of a pillar. Such a diode is formed of a semiconductor material such as silicon, germanium, or a silicon-germanium alloy, and has a bottom heavily doped region of a first semiconductor type, a middle intrinsic or lightly doped region, and a top heavily doped region of a second semiconductor type opposite the first. It has been described to form this diode in both orientations, either having a bottom heavily doped p-type region and a top heavily doped n-type region; or the reverse, with a bottom heavily doped n-type region and the top heavily doped p-type region.

Figure 1:
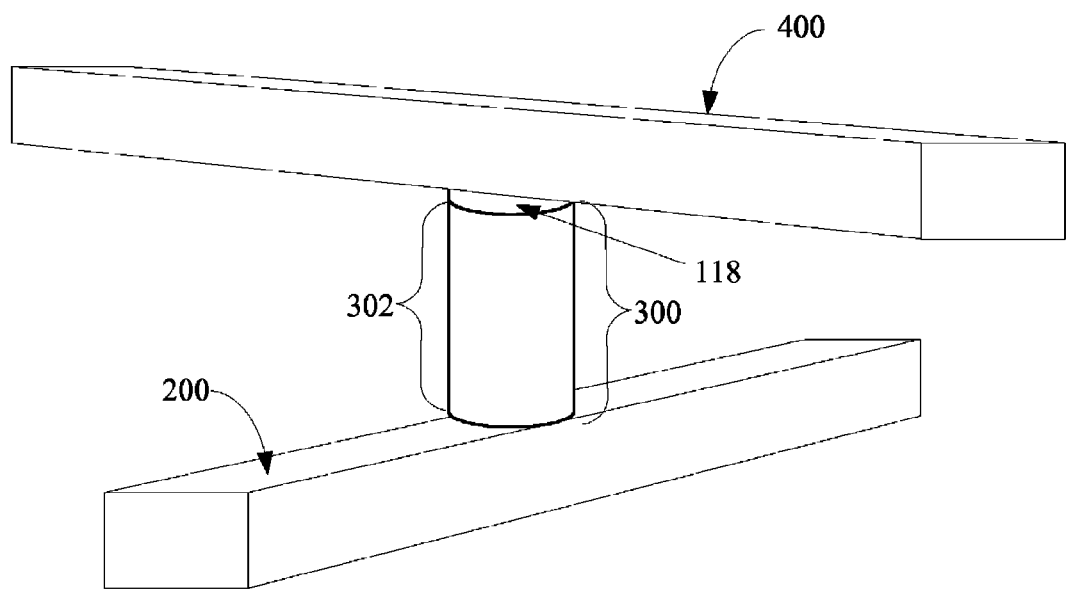
FIG. 1 is a perspective view of an embodiment of a memory cell described in the '030 patent.

FIG. 1 illustrates a memory cell formed according to an embodiment of the '030 patent. Such a memory cell includes a bottom conductor 200 and a top conductor 400, with a vertically oriented p-i-n diode 302 and a dielectric rupture antifuse 118 arranged electrically in series between them. In its initial, unprogrammed state, when a read voltage, for example of 2 volts, is applied between bottom conductor 200 and top conductor 400, very little current flows between them. Application of a relatively large programming voltage alters the memory cell, and, after programming, significantly more current flows between bottom conductor 200 and top conductor 400 at the same read voltage. This difference in current between the unprogrammed and programmed states is measurable, and each can correspond to a distinct data state; for example an unprogrammed cell can be considered to be a data "0" while a programmed cell is a data "1".

Figure 2:
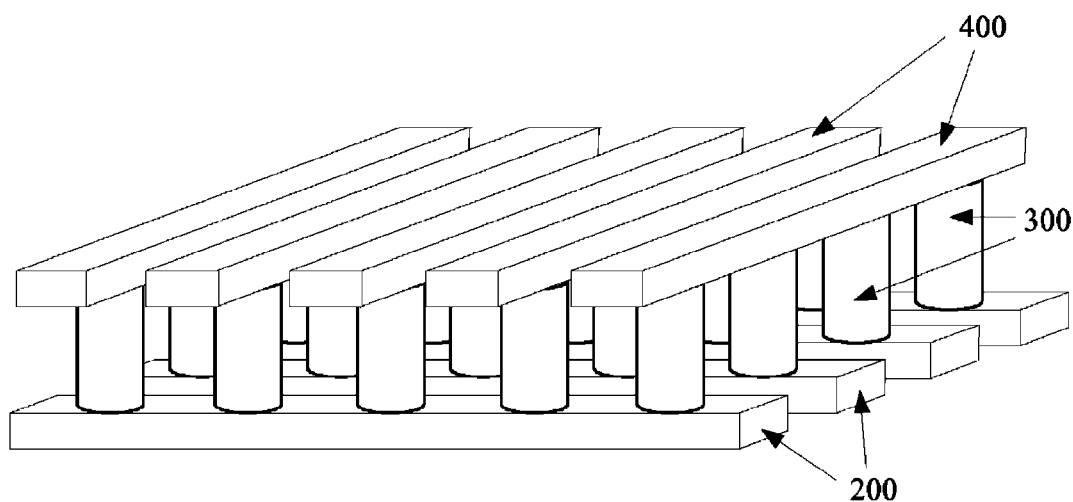
FIG. 2 is a perspective view of a portion of a first memory level comprising memory cells like the cell of FIG. 1.

FIG. 2 shows a portion of a first memory level comprising a plurality of bottom conductors 200, a plurality of pillars 300, each pillar including a diode and a dielectric rupture antifuse as in FIG. 1, and a plurality of top conductors 400. Each pillar 300 is disposed between one of the bottom conductors 200 and one of the top conductors 400. Such a memory level can be formed above a substrate such as a conventional monocrystalline silicon wafer. Multiple memory levels can be formed stacked above the first to form a dense monolithic three dimensional memory array.

A diode is a rectifying device, conducting current more readily in one direction than in the other. A diode can be said to point in its direction of preferred conduction. A vertically oriented diode having n-type semiconductor material at the bottom and p-type semiconductor material at the top can be said to be downward-pointing, while a vertically oriented diode having p-type semiconductor material at the bottom and n-type semiconductor material at the top can be said to be upward-pointing. Note that in this application, when terms indicating spatial relationships, like "upward", "downward", "above", "below", and the like are used, these terms are relative to the substrate, which is assumed to be at the bottom of the frame of reference. For example, if a first element is described to be above a second element, the first element is farther from the substrate than the second.

Figure 3A:
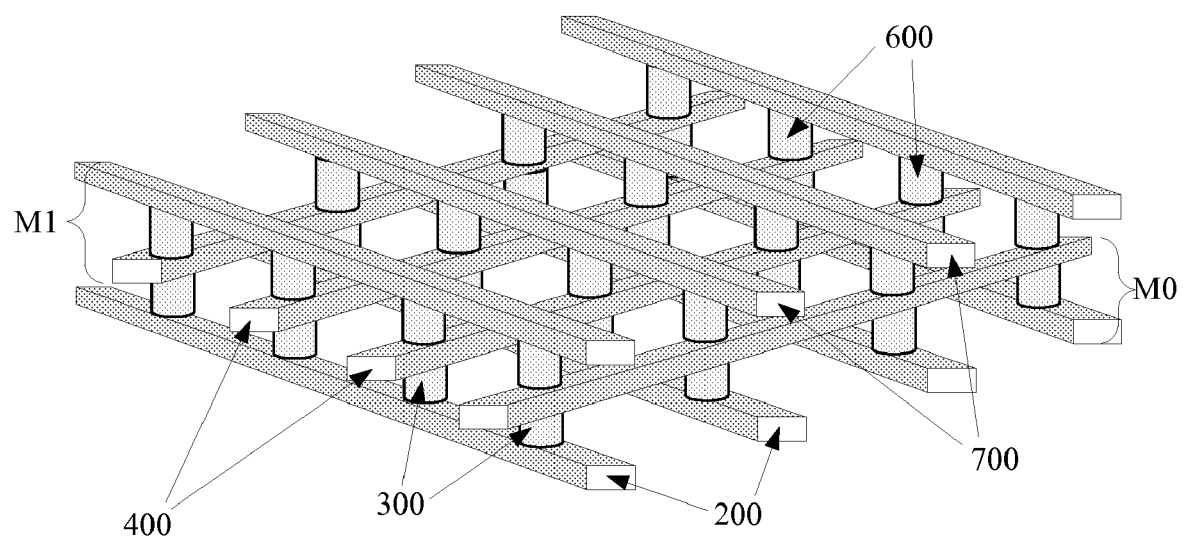
FIG. 3a is a perspective view showing two stacked memory levels sharing conductors.
Figure 3B:
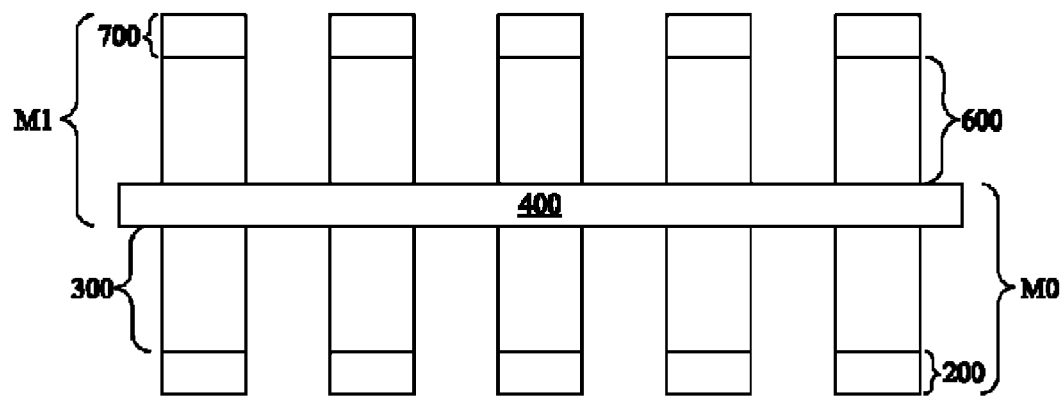
FIG. 3b is a cross-sectional view of the same structure.
Figure 3C:
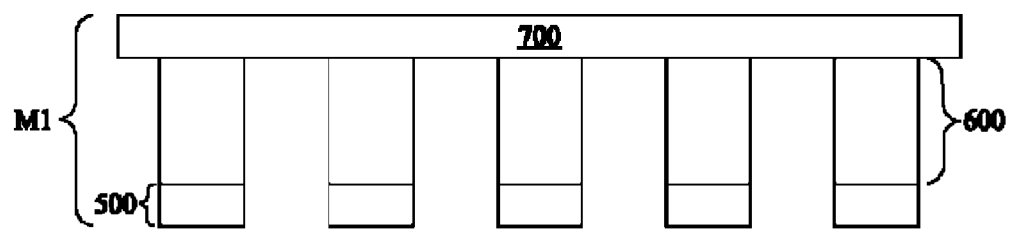
FIG. 3c is a cross-sectional view showing two stacked memory levels not sharing conductors.
Figure 3C:
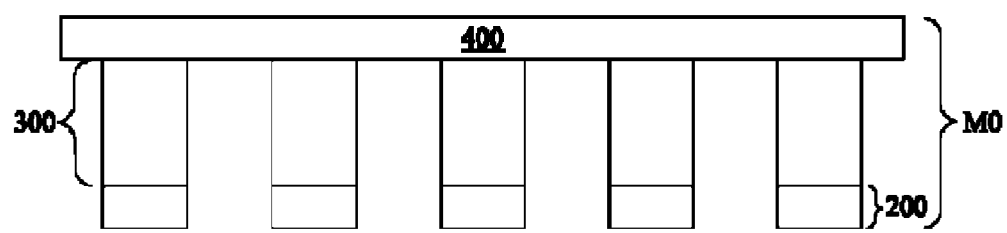

In a vertically stacked memory array, it is preferred for vertically adjacent memory levels to share conductors, as shown in perspective view in FIG. 3a, in which the conductors 400 serve both as the top conductors of the first memory level M0 and as the bottom conductors of the second memory level M1. The same structure is shown in a cross-sectional view in FIG. 3b. FIG. 3c show a cross-sectional view of an array in which conductors are not shared. In FIG. 3c, each memory level has bottom conductors (200, 500), pillars (300, 600), and top conductors (400, 700), with an interlevel dielectric separating memory levels M0 and M1, with no conductors shared. The architecture of FIGS. 3a and 3b requires fewer masking steps and reduces fabrication costs to produce the same density of memory cells as shown in FIG. 3c. Sharing of conductors, as in FIGS. 3a and 3b, is most readily achieved electrically if diodes on adjacent levels point in opposite directions, for example if the first memory level M0 diodes are upward-pointing, while the second memory level M1 diodes are downward-pointing. A stacked array of only upward-pointing or only downward-pointing diodes will generally be formed with conductors not shared, as in FIG. 3c.

A large memory array will typically include millions of memory cells, each of which must be sensed. There will inevitably be some variation in characteristics between memory cells in such a large array. To improve reliability, for a large array of memory cells, it is advantageous to maximize the difference between the unprogrammed and the programmed states, making them easier to distinguish. It is further advantageous to minimize variation between cells, and for the cells to behave as uniformly as possible.

Figure 4A:
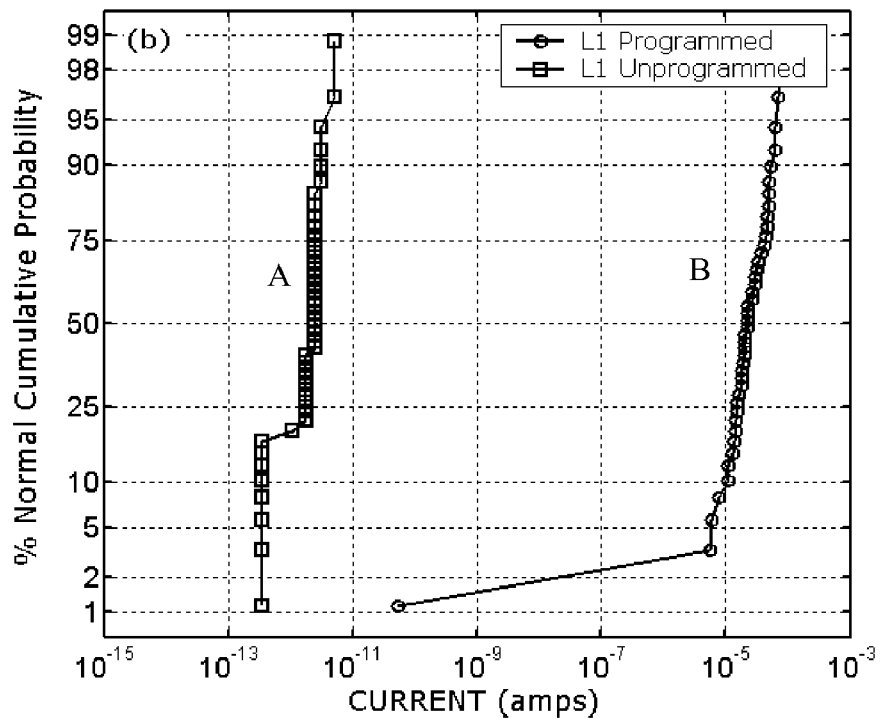
FIG. 4a is a probability plot of current at applied voltage of 2 volts for a population of downward-pointing diodes formed according to an embodiment of the '030 patent.

FIG. 4a is a probability plot showing unprogrammed current and programmed current under the same applied read voltage for a population of memory cells like those of the '030 patent (shown in FIG. 1) including a diode and an antifuse in series between conductors in which the diodes are all downward-pointing; i.e. the diodes have a bottom heavily doped n-type region, a middle intrinsic region, and a top heavily doped p-type region. It will be seen that the unprogrammed current for the downward-pointing diodes, shown on line A, is tightly grouped close to $10^{-12}$ amps. Similarly, the programmed current, shown on line B, with the exception of one outlier, is tightly grouped between about $10^{-5}$ and $10^{-4}$ amps. The distributions of unprogrammed current (line A) and programmed current (line B) are spaced well apart from each other and both are tightly grouped.

Figure 4B:
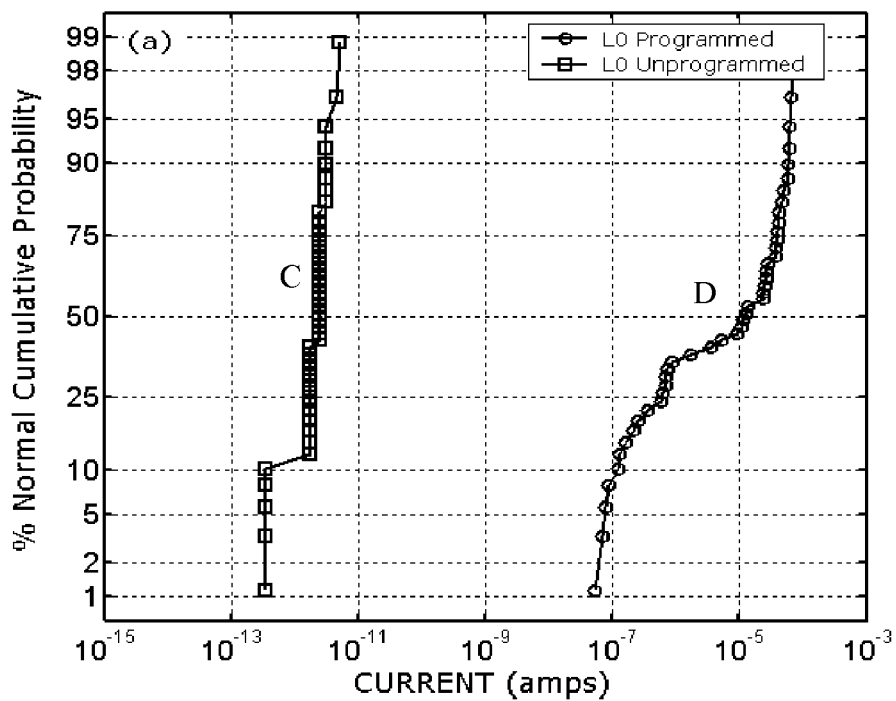
FIG. 4b is a probability plot of current at applied voltage of 2 volts for a population of upward-pointing diodes formed according to an embodiment of the '030 patent.

FIG. 4b is a probability plot showing unprogrammed current and programmed current for a population of upward-pointing diodes formed as in the '030 patent. The unprogrammed current, shown on line C, is very similar to the unprogrammed current of the downward pointing diode, line A of FIG. 4a. The programmed current, however, shown on line D, shows a much wider distribution than the programmed current on line B of FIG. 4a. Programmed current for this upward-pointing diode ranges from about $8 \times 10^{-8}$ amps to $7 \times 10^{-5}$ amps, a difference approaching three orders of magnitude. A large number of the population of these diodes have programmed current less than 1 microamp. This nonuniformity and low programmed current make the upward-pointing diode of the '030 patent a less advantageous diode for use in a large array than the downward-pointing diode.

Figure 5:
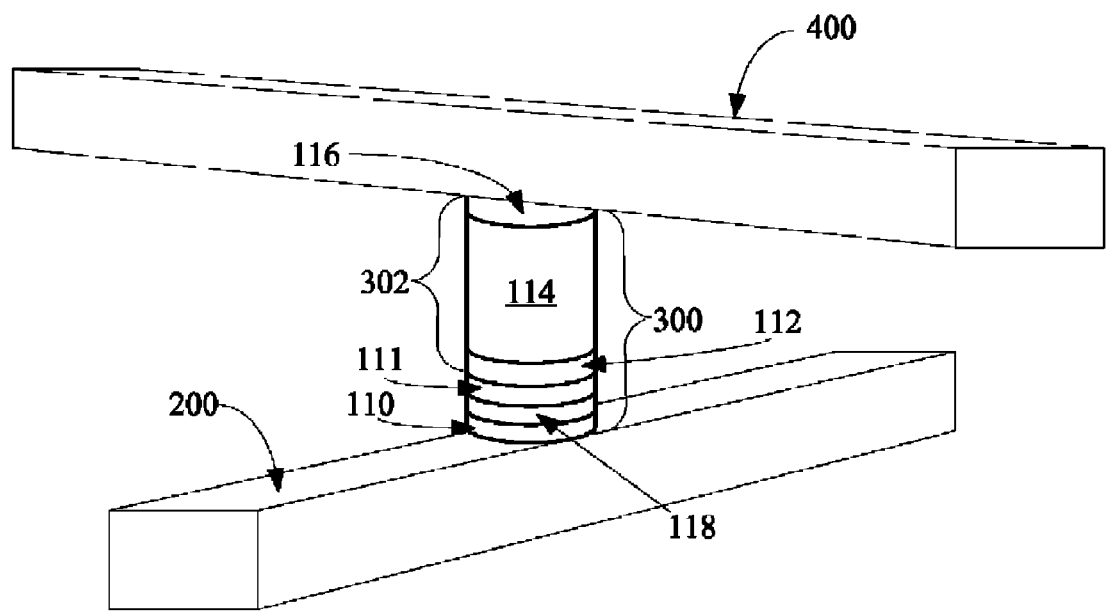
FIG. 5 is perspective view of an embodiment of the present invention.

In the present invention, a fabrication technique has been found that yields a large population of upward-pointing vertically oriented p-i-n diodes having good uniformity and large programmed current. FIG. 5 shows an example of a memory cell including an upward-pointing diode formed according to an embodiment of the present invention. In this memory cell, the diode is paired with a dielectric rupture antifuse, but, as will be described, the pictured memory cell is only one of many possible uses for such a diode, and is provided for clarity.

Figure 6:
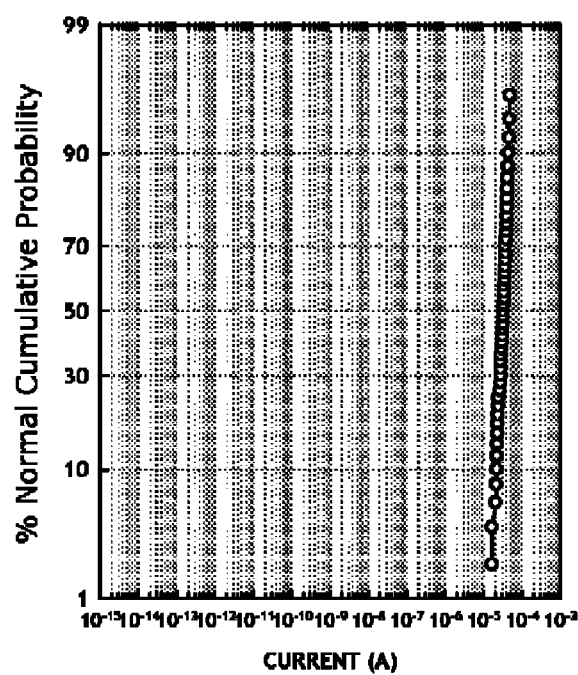
FIG. 6 is a probability plot of current at applied voltage of 2 volts for a population of upward-pointing diodes formed according to the present invention.

The memory cell includes first conductor 200 and second conductor 400. Disposed between them are dielectric rupture antifuse 118 (shown sandwiched between conductive barrier layers 110 and 111) and diode 302. Diode 302 includes bottom heavily doped p-type region 112, middle intrinsic region 114, and top heavily doped n-type region 116. Diode 302 is formed of semiconductor material, for example silicon, germanium, or a silicon-germanium alloy. For simplicity, this semiconductor material will be described as silicon. The silicon is preferably predominantly amorphous as deposited (though p-type region 112, if doped in situ, will likely be polycrystalline as deposited.) Top heavily doped n-type region 116 is doped with arsenic. In preferred embodiments, region 116 is formed by forming middle intrinsic region 114, then doping the top of middle intrinsic region 114 with arsenic by ion implantation. As will be seen, this ion implantation step may take place either before or after the patterning and etching step that forms the pillar. In alternative embodiments, region 116 may be doped in situ by flowing an appropriate source gas such as $AsH_3$ during silicon deposition at flows sufficient to result in an arsenic concentration of at least $5 \times 10^{20}$ atoms/cm$^3$. The bottom layer of top conductor 400 is a silicide-forming metal such as titanium, cobalt, chromium, tantalum, platinum, niobium, or palladium. Titanium and cobalt are preferred; titanium is most preferred. During an anneal performed to crystallize the silicon, the silicide-forming metal reacts with the silicon of top heavily doped n-type region 116 and forms a silicide layer, for example titanium silicide. FIG. 6 is a probability plot showing current at a read voltage of about 2 volts for a population of such upward-pointing diodes; as will be seen, this population has good uniformity, with very little variation between diodes, and relative large forward current, with median current of about 35.5 microamps. In particular, note that programmed current at 2 volts for all diodes in this population is above about 3 microamps.

As described, memory cells in the array described are sensed by applying a read voltage across the memory cell. Ideally the read voltage applied is the same for every memory cell in the array; in practice there will be some variation due to the location of each memory cell within the array. For example, cells located farther from sensing circuitry have a longer interconnect than cells located closer to it. The increased length of the interconnect results in increased resistance, resulting in smaller voltages across the diodes of more distant cells as compared to closer ones. Small variations in the read current of the diode due to variations in the interconnect length, and resistance, are not inherent properties of the diode of the present invention, however. The term device level will refer to a plurality of substantially coplanar devices formed at the same level above a substrate, and generally by the same processing steps; an example of a device level is a memory level including a plurality of substantially coplanar memory cells formed above a substrate. In one example, in a device level including a population of upward-pointing p-i-n diodes formed according to the present invention, the voltage applied across the diode, i.e. between the bottom p-type region and the top n-type region of the diode, is between about 1.8 volts and about 2.2 volts for any diode in the device level, regardless of its location; and current flowing through 99 percent of the diodes in this device level under this applied voltage is at least 1.5 microamps. In other examples, in the present invention a current of about 1.5 microamps is achievable for 99 percent of diodes in a device level when the voltage applied across the diode (between the bottom p-type region and the top n-type region of the diode) is between about 1.1 volts and about 3.0 volts, preferably between about 1.5 volts and about 3.0 volts, most preferably between about 1.8 volts and about 2.2 volts, for example when the semiconductor material is a silicon-germanium alloy such as $Si_{0.8}Ge_{0.2}$. This population of p-i-n diodes may be a device level having 100,000 p-i-n diodes or more, for example 1,000,000 p-i-n diodes or more.

In preferred embodiments, the device level is a memory level comprising memory cells of the present invention, wherein the first memory cells comprise programmed cells and unprogrammed cells. In such a memory array, during use, some cells will be programmed while others are unprogrammed. In a preferred embodiment, when at least half of the memory cells are programmed cells, current flowing through the p-i-n diodes of at least 99 percent of the programmed cells when a voltage between about 1.5 volts and about 3.0 volts is applied between the bottom heavily doped p-type region and the top heavily doped n-type region is at least 1.5 microamps, wherein the first plurality of memory cells includes every memory cell in the first memory level. In more preferred embodiments, the applied voltage is between about 1.8 volts and about 2.2 volts. This memory level of memory cells may include 100,000 cells or more, for example 1,000,000 cells or more, each cell including an upward-pointing p-i-n diode formed according to the present invention.

The upward-pointing diode of the present invention can advantageously be used in an array of stacked memory levels sharing conductors, most preferably having upward-pointing diodes alternating with downward-pointing diodes on each memory level.

As described in Herner et al., U.S. patent application Ser. No. 11/148,530, "Nonvolatile Memory Cell Operating by Increasing Order in Polycrystalline Semiconductor Material," filed Jun. 8, 2005, hereby incorporated by reference, when deposited amorphous silicon is crystallized in contact solely with materials with which it has a high lattice mismatch, such as silicon dioxide and titanium nitride, the polycrystalline silicon or polysilicon forms with a high number of crystalline defects, causing it to be high-resistivity. Application of a programming pulse through this high-defect polysilicon apparently alters the polysilicon, causing it to be lower-resistivity.

As described further in the '549 application; as well as in Herner, U.S. Pat. No. 7,176,064, "Memory Cell Comprising a Semiconductor Junction Diode Crystallized Adjacent to a Silicide"; and in Herner, U.S. patent application Ser. No. 11/560,283, "Method for Making a P-I-N Diode Crystallized Adjacent to a Silicide in Series with A Dielectric Antifuse," filed Nov. 15, 2006, hereinafter the '283 application and hereby incorporated by reference, it has been found that when deposited amorphous silicon is crystallized in contact with a layer of an appropriate silicide, for example titanium silicide, cobalt silicide, or a silicide formed of one of the other named silicide-forming metals, the resulting crystallized silicon is much higher quality, with fewer defects, and has much lower resistivity. The lattice spacing of titanium silicide or cobalt silicide is very close to that of silicon, and it is believed that when amorphous silicon is crystallized in contact with a layer of an appropriate silicide at a favorable orientation, the silicide provides a template for crystal growth of silicon, minimizing formation of defects. Unlike the high-defect silicon crystallized adjacent only to materials with which it has a high lattice mismatch, application of a large electrical pulse does not appreciably change the resistivity of this low-defect, low-resistivity silicon crystallized in contact with the silicide layer.

In some memory cells using a vertically oriented p-i-n diode, then, as in the '549 application, the diode is formed of higher-defect, higher-resistivity polysilicon, and the memory cell is programmed by changing the resistivity state of the polysilicon. For these high-defect-diode cells, the data state of the memory cell is stored predominantly in the resistivity state of the polysilicon of the diode. In other memory cells, as in the '283 application, the diode is formed of low-defect, low-resistivity silicon, is paired with a companion state-change element (in this case a dielectric rupture antifuse) and the memory cell is programmed by changing the characteristics of the state-change element (by rupturing the antifuse, for example.) The term state-change element is used to describe an element that can take two or more stable, mutually distinguishable states, usually resistivity states, and can either reversibly or irreversibly be switched between them. For these low-defect-diode cells, the data state of the memory cell is stored predominantly in the state-change element, not in the state of the diode. (Note that this discussion has described the use of silicon crystallized adjacent to a silicide. The same effect can be expected for germanium and silicon-germanium crystallized adjacent to a germanide or silicide-germanide.)

The upward-pointing p-i-n diodes of the present invention are crystallized in contact with a silicide, and are thus of low-defect, low-resistivity semiconductor material. If the upward-pointing diodes of the present invention, then, are used in memory cells, they are advantageously used when paired with a state-change element, for example an antifuse or a resistivity-switching element. One example of such a resistivity-switching element is a binary metal oxide, such as $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, or $Al_xN_y$, as described in Herner et al., U.S. patent application Ser. No. 11/395,995, "Nonvolatile Memory Cell Comprising a Diode and a Resistance-Switching Material," filed Mar. 31, 2006, and hereby incorporated by reference. Another example of a resistivity-switching element is a carbon nanotube fabric, as described in Herner et al. application Ser. No. 11/692,142, filed on even date herewith.

Note that the upward-pointing diodes of the present invention may advantageously be used in many devices, and is not limited to use in memory cells; or, if used in memory cells, is not limited to use in cells like those specifically described herein.

A detailed example will be provided describing fabrication of a first memory level formed above a substrate, the memory level comprising memory cells having an upward-pointing diode and high-K dielectric antifuse arranged in series between a bottom conductor and a top conductor, as well fabrication of a second memory level above it comprising downward-pointing diodes, the two memory levels sharing conductors. Details from the '283 application, and from the other incorporated applications, may prove useful in fabrication of this memory level. To avoid obscuring the invention, not all details from these or other incorporated documents will be included, but it will be understood that none of their teaching is intended to be excluded. For completeness, many details, including materials, steps, and conditions, will be provided, but it will be understood by those skilled in the art that many of these details can be changed, augmented or omitted while the results fall within the scope of the invention.

EXAMPLE

Figure 7A:
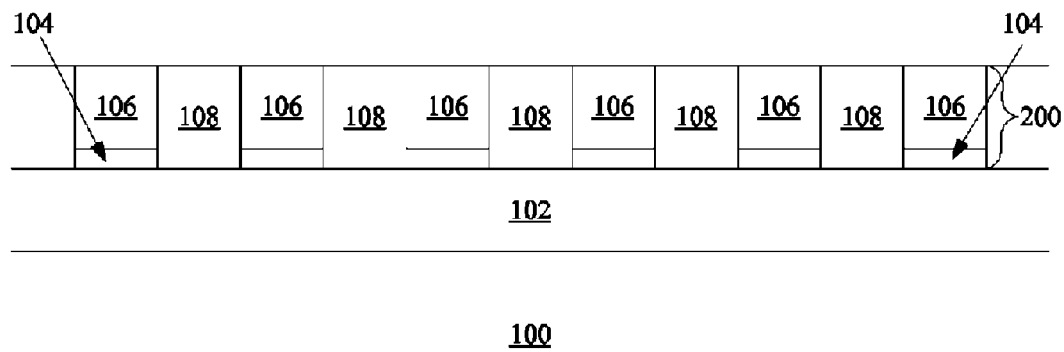
FIGS. 7a-7d are cross-sectional views illustrating stages in formation of two memory levels, the first memory level including upward-pointing diodes formed according to an embodiment of the present invention.

Turning to FIG. 7a, formation of the memory begins with a substrate 100. This substrate 100 can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, Si—C—O—H film, or any other suitable insulating material.

The first conductors 200 are formed over the substrate 100 and insulator 102. An adhesion layer 104 may be included between the insulating layer 102 and the conducting layer 106 to help conducting layer 106 adhere to insulating layer 102. If the overlying conducting layer 106 is tungsten, titanium nitride is preferred as adhesion layer 104. Conducting layer 106 can comprise any conducting material known in the art, such as tungsten, or other materials, including tantalum, titanium, or alloys thereof.

Once all the layers that will form the conductor rails have been deposited, the layers will be patterned and etched using any suitable masking and etching process to form substantially parallel, substantially coplanar conductors 200, shown in FIG. 7a in cross-section. Conductors 200 extend out of the page. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide deposited by a high-density plasma method is used as dielectric material 108.

Finally, excess dielectric material 108 on top of conductor rails 200 is removed, exposing the tops of conductor rails 200 separated by dielectric material 108, and leaving a substantially planar surface. The resulting structure is shown in FIG. 7a. This removal of dielectric overfill to form the planar surface can be performed by any process known in the art, such as chemical mechanical planarization (CMP) or etchback. In an alternative embodiment, conductors 200 could be formed by a Damascene method instead.

Figure 7B:
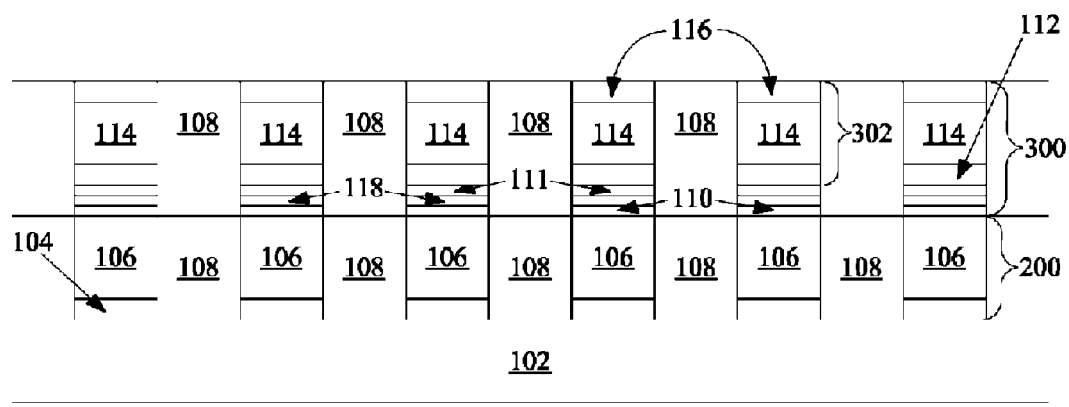

Turning to FIG. 7b, next optional conductive layer 110 is deposited. Layer 110 is a conductive material, for example titanium nitride, tantalum nitride, or tungsten. This layer may be any appropriate thickness, for example about 50 to about 200 angstroms, preferably about 100 angstroms. In some embodiments barrier layer 110 may be omitted.

Next, in this example, a thin layer 118 of a dielectric material or dielectric stack is deposited to form a dielectric rupture antifuse. In one embodiment, a high-K dielectric, such as $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, or $ZrSiAlON$, is deposited, for example by atomic layer deposition. $HfO_2$ and $Al_2O_3$ are preferred. If $HfO_2$ is used, layer 118 preferably has a thickness between about 5 and about 100 angstroms, preferably about 40 angstroms. If $Al_2O_3$ is used, layer 118 preferably has a thickness between about 5 and about 80 angstroms, preferably about 30 angstroms. In alternative embodiments, the dielectric rupture antifuse may comprise silicon dioxide.

Conductive layer 111 is deposited on layer 118. It can be any appropriate conductive material, for example titanium nitride, with any appropriate thickness, for example about 50 to about 200 angstroms, preferably about 100 angstroms. In some embodiments conductive layer 111 may be omitted.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

Bottom heavily doped region 112 can be formed by any deposition and doping method known in the art. The silicon can be deposited and then doped, but is preferably doped in situ by flowing a donor gas providing a p-type dopant atoms, for example boron, during deposition of the silicon. In preferred embodiments, the donor gas is $BCl_3$, and p-type region 112 is preferably doped to a concentration of about $1 \times 10^{21}$ atoms/cm$^3$. Heavily doped region 112 is preferably between about 100 and about 800 angstroms thick, most preferably about 200 angstroms thick.

Intrinsic or lightly doped region 114 can be formed next by any method known in the art. Region 114 is preferably silicon and has a thickness between about 1200 and about 4000 angstroms, preferably about 3000 angstroms. In general p-type dopants such as boron tend to promote crystallization; thus the silicon of heavily doped region 112 is like to be polycrystalline as deposited. Intrinsic region 114, however, is preferably amorphous as deposited.

Semiconductor regions 114 and 112 just deposited, along with underlying conductive layer 111, dielectric rupture antifuse 118, and conductive layer 110, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The diameter of the pillars 300 can be as desired, for example between about 22 nm and about 130 nm, preferably between about 32 nm and about 80 nm, for example about 45 nm. Gaps between pillars 300 are preferably about the same as the diameter of the pillars. Note that when a very small feature is patterned as a pillar, the photolithography process tends to round corners, such that the cross-section of the pillar tends to be circular, regardless of the actual shape of the corresponding feature in the photomask.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped n-type top regions 116. The n-type dopant is preferably a shallow implant of arsenic, with implant energy of, for example, 10 keV, and dose of about $3 \times 10^{15}/cm^2$. This implant step completes formation of diodes 302. Note that some thickness, for example about 300 to about 800 angstroms of silicon is lost during CMP; thus the finished height of diode 302 may be between about 800 and about 4000 angstroms, for example about 2500 angstroms for a diode having a feature size of about 45 nm.

Figure 7C:
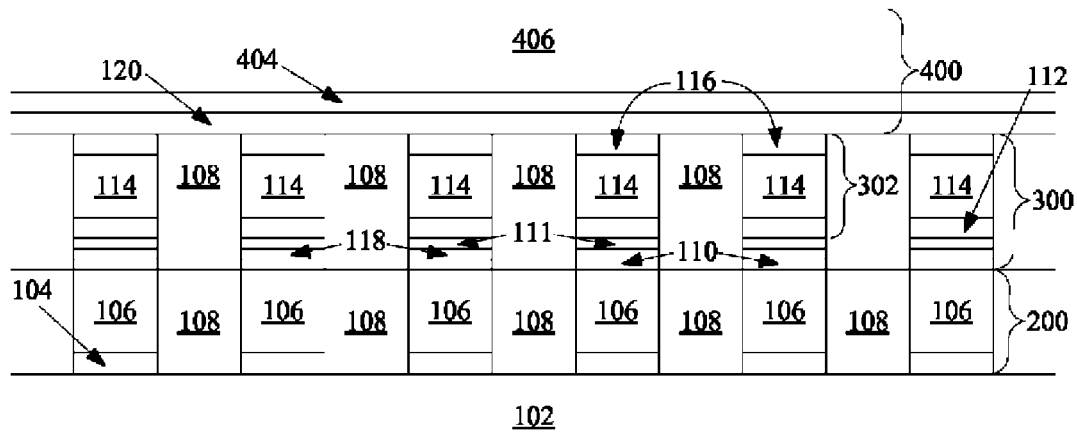

Turning to FIG. 7c, next a layer 120 of a silicide-forming metal, for example titanium, cobalt, chromium, tantalum, platinum, niobium, or palladium, is deposited. Layer 120 is preferably titanium or cobalt; if layer 120 is titanium, its thickness is preferably between about 10 and about 100 angstroms, most preferably about 20 angstroms. Layer 120 is followed by titanium nitride layer 404. Layer 404 is preferably between about 20 and about 100 angstroms, most preferably about 80 angstroms. Next a layer 406 of a conductive material, for example tungsten, is deposited; for example this layer may be about 1500 angstroms of tungsten formed by CVD. Layers 406, 404, and 120 are patterned and etched into rail-shaped top conductors 400, which preferably extend in a direction perpendicular to bottom conductors 200. The pitch and orientation of top conductors 400 is such that each conductor 400 is formed on top of and contacting a row of pillars 300, and conductors 400 preferably have about the same width as pillars 300. Some misalignment can be tolerated.

Next a dielectric material (not shown) is deposited over and between conductors 400. The dielectric material can be any known electrically insulating material, such as silicon oxide, silicon nitride, or silicon oxynitride. In a preferred embodiment, silicon oxide is used as this dielectric material.

Referring to FIG. 7c, note that layer 120 of a silicide-forming metal is in contact with the silicon of top heavily doped region 116. During subsequent elevated temperature steps, the metal of layer 120 will react with some portion of the silicon of heavily doped region p-type 116 to form a silicide layer (not shown), which is between the diode and top conductor 400; alternatively this silicide layer can be considered to be part of top conductor 400. This silicide layer forms at a temperature lower than the temperature required to crystallize silicon, and thus will form while intrinsic region 114 and heavily doped p-type region 116 are still largely amorphous. If a silicon-germanium alloy is used for top heavily doped region 116, a silicide-germanide layer may form, for example of cobalt silicide-germanide or titanium silicide-germanide. Similarly, if germanium is used, a germanide will form.

In the example just described, the diodes 302 of FIG. 7c are upward-pointing, comprising a bottom heavily doped p-type region, a middle intrinsic region, and top heavily doped n-type region. In preferred embodiments, the next memory level to be monolithically formed above this one shares conductor 400 with the first memory level just formed; i.e., the top conductor 400 of the first memory level serves as the bottom conductor of the second memory level. If conductors are shared in this way, then the diodes in the second memory level are preferably downward-pointing, comprising a bottom heavily doped n-type region, a middle intrinsic region, and a top heavily doped p-type region.

Figure 7D:
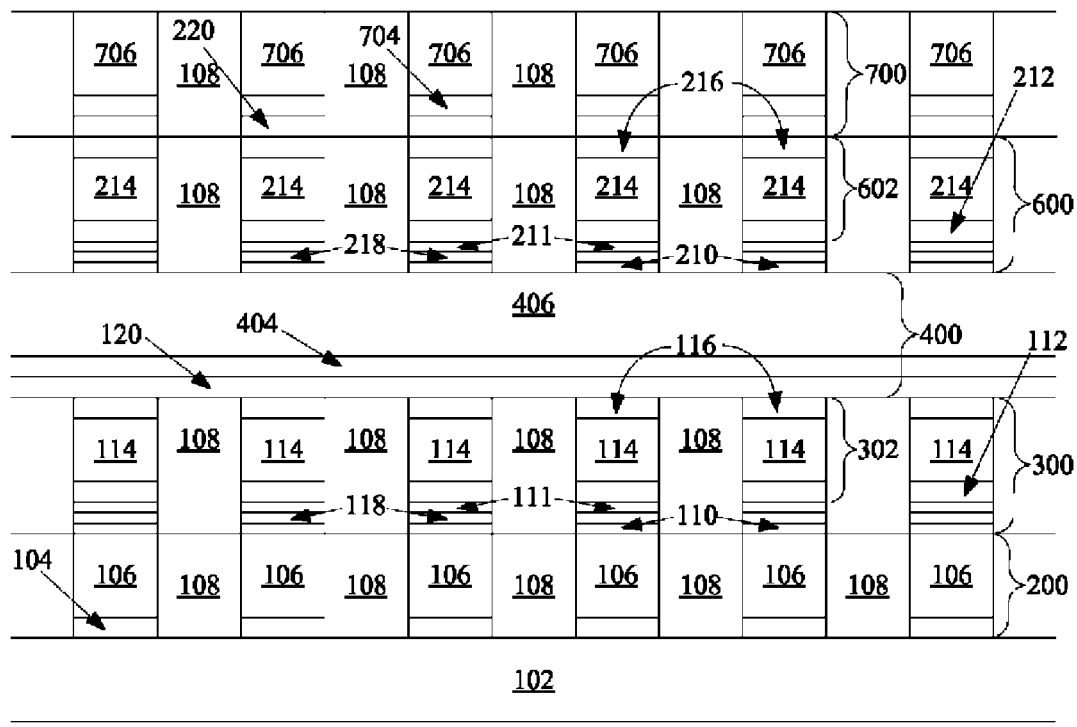

Turning to FIG. 7d, next optional conductive layer 210, high-K dielectric antifuse layer 218, and optional conductive layer 211 are formed, preferably of the same materials, the same thicknesses, and using the same methods as layers 110, 118, and 111, respectively, of pillars 300 in the first memory level.

Diodes are formed next. Bottom heavily doped region 212 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 212 is preferably between about 100 and about 800 angstroms thick, most preferably about 100 to about 200 angstroms thick.

The next semiconductor region to be deposited is preferably undoped. In deposited silicon, though, n-type dopants such as phosphorus exhibit strong surfactant behavior, tending to migrate toward the surface as the silicon is deposited. Deposition of silicon will continue with no dopant gas provided, but phosphorus atoms migrating upward, seeking the surface, will unintentionally dope this region. As described in Herner, U.S. patent application Ser. No. 11/298,331, "Deposited Semiconductor Structure to Minimize N-Type Dopant Diffusion and Method of Making," filed Dec. 9, 2005, hereby incorporated by reference, the surfactant behavior of phosphorus in deposited silicon is inhibited with the addition of germanium. Preferably a layer of a silicon-germanium alloy including at least 10 at % germanium is deposited at this point, for example about 200 angstroms of $Si_{0.8}Ge_{0.2}$, which is deposited undoped, with no dopant gas providing phosphorus. This thin layer is not shown in FIG. 7d.

Use of this thin silicon-germanium layer minimizes unwanted diffusion of n-type dopant into the intrinsic region to be formed, maximizing its thickness. A thicker intrinsic region minimizes leakage current across the diode when the diode is under reverse bias, reducing power loss. This method allows the thickness of the intrinsic region to be increased without increasing the overall height of the diode. As will be seen, the diodes will be patterned into pillars; increasing the height of the diode increases the aspect ratio of the etch step forming these pillars and the step to fill gaps between them. Both etch and fill are more difficult as aspect ratio increases.

Intrinsic region 214 can be formed next by any method known in the art. Region 214 is preferably silicon and preferably has a thickness between about 1100 and about 3300 angstroms, preferably about 1700 angstroms. The silicon of heavily doped region 212 and intrinsic region 214 is preferably amorphous as deposited.

Semiconductor regions 214 and 212 just deposited, along with underlying conductive layer 211, high-K dielectric layer 218, and conductive layer 210, will be patterned and etched to form pillars 600. Pillars 600 should have about the same pitch and about the same width as conductors 400 below, such that each pillar 600 is formed on top of a conductor 400. Some misalignment can be tolerated. Pillars 600 can be patterned and etched using the same techniques used to form pillars 300 of the first memory level.

Dielectric material 108 is deposited over and between the semiconductor pillars 600, filling the gaps between them. As in the first memory level, the dielectric material 108 on top of pillars 600 is removed, exposing the tops of pillars 600 separated by dielectric material 108, and leaving a substantially planar surface. After this planarization step, ion implantation is performed, forming heavily doped p-type top regions 116. The p-type dopant is preferably a shallow implant of boron, with an implant energy of, for example, 2 keV, and dose of about $3\times10^{15}/cm^2$. This implant step completes formation of diodes 602. Some thickness of silicon is lost during the CMP step, so the completed diodes 602 have a height comparable to that of diodes 302.

Top conductors 700 are formed in the same manner and of the same materials as conductors 400, which are shared between the first and second memory levels. A layer 220 of a silicide-forming metal is deposited, followed by titanium nitride layer 704 and layer 706 of a conductive material, for example tungsten. Layers 706, 704, and 220 are patterned and etched into rail-shaped top conductors 700, which preferably extend in a direction substantially perpendicular to conductors 400 and substantially parallel to conductors 200.

Preferably after all of the memory levels have been formed, a single crystallizing anneal is performed to crystallize the semiconductor material of diodes 302, 602, and those diodes formed on additional levels, for example at 750 degrees C. for about 60 seconds, though each memory level can be annealed as it is formed. The resulting diodes will generally be polycrystalline. Since the semiconductor material of these diodes is crystallized in contact with a silicide or silicide-germanide layer with which it has a good lattice match, the semiconductor material of diodes 302, 602, etc. will be low-defect and low-resistivity.

In the embodiment just described, conductors were shared between memory levels; i.e. top conductor 400 of the first memory level serves as the bottom conductor of the second memory level. In other embodiments, an interlevel dielectric can be formed above the first memory level of FIG. 7c, its surface planarized, and construction of a second memory level begun on this planarized interlevel dielectric, with no shared conductors. In the example given, the diodes of the first memory level were upward-pointing, with p-type silicon on the bottom and n-type on top, while the diodes of the second memory level were reversed, pointing downward with n-type silicon on the bottom and p-type on top. In embodiments in which conductors are shared, diode types preferably alternate, upward on one level and downward on the next. In embodiments in which conductors are not shared, diodes may be all one type, either upward- or downward-pointing. The terms upward and downward refer to the direction of current flow when the diode is under forward bias.

In some embodiments, it may be preferred for the programming pulse to be applied with the diode in reverse bias. This may have advantages in reducing or eliminating leakage across the unselected cells in the array, as described in Kumar et al., U.S. patent application Ser. No. 11/496,986, "Method For Using A Memory Cell Comprising Switchable Semiconductor Memory Element With Trimmable Resistance," filed Jul. 28, 2006, owned by the assignee of the present invention and hereby incorporated by reference.

Fabrication of two memory levels above a substrate has been described. Additional memory levels can be formed in the same manner, forming a monolithic three dimensional memory array.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a stacked memory array in which conductors are formed using Damascene construction, rather than using subtractive techniques as in the examples provided, is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention. In the methods of Radigan et al., a conductive hard mask is used to etch the diodes beneath them. In adapting this hard mask to the present invention, in preferred embodiments the bottom layer of the hard mask, which is in contact with the silicon of the diode, is preferably titanium, cobalt, chromium, tantalum, platinum, niobium, or palladium. During anneal, then, a silicide forms, providing the silicide crystallization template. In this embodiment, the ion implantation step to form the top heavily doped p-type region takes place before the patterning step to form the pillars.

In the examples provided so far, the silicide is formed at the top contact of the diode. In alternative embodiments, it may be formed elsewhere, for example at the bottom contact. For example, the silicon of the diode can be deposited directly on a silicide-forming metal, and a state-change element, such as an antifuse or a resistivity-switching element (carbon nanotube fabric or a binary metal oxide, for example) formed on top of the diode.

The upward-pointing diode of the present invention has been described as used in a one-time programmable memory cell (when paired with an antifuse) or in a rewriteable memory cell (when paired with a resistivity-switching element.) It will be understood, however, it is impractical to list all possible uses of the diode of the present invention, and that these examples are not intended to be limiting.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a vertically oriented p-i-n diode, the method comprising:
   forming a first rail-shaped conductor above a substrate;
   forming the p-i-n diode by:
   (a) forming a bottom heavily doped p-type region of deposited semiconductor material above the first rail-shaped conductor;
   (b) forming a middle intrinsic or lightly doped region of deposited semiconductor material above the bottom heavily doped p-type region of deposited semiconductor material, wherein the middle intrinsic or lightly doped region of deposited semiconductor material is silicon, germanium, or a silicon-germanium alloy;
   (c) patterning and etching the bottom heavily doped p-type region and the middle intrinsic or lightly doped region to form a pillar;
   (d) forming a top heavily doped n-type region of deposited semiconductor material by doping with arsenic;
   forming a silicide-forming metal region in contact with the top heavily doped n-type region of the p-i-n diode;
   forming a silicide, germanide, or silicide-germanide by reacting the silicide-forming metal region with the top heavily doped n-type region of the p-i-n diode; and
   annealing to crystallize the deposited semiconductor material, where some portion of the deposited semiconductor material was amorphous as deposited and is in contact with the silicide, germanide, or silicide-germanide before the annealing step.

2. The method of claim 1 wherein the silicide is titanium silicide, titanium germanide, titanium silicide-germanide, cobalt silicide, cobalt germanide, or cobalt silicide-germanide.

3. The method of claim 1 wherein the top heavily doped n-type region is doped in situ.

4. The method of claim 1 wherein the top heavily doped n-type region is doped by doping the top of the middle intrinsic or lightly doped region by ion implantation.

5. The method of claim 4 wherein ion implantation to form the top heavily doped n-type region takes place before the patterning and etching step.

6. The method of claim 4 wherein ion implantation to form the top heavily doped n-type region takes place after the patterning and etching step.

7. The method of claim 1 further comprising forming a titanium, cobalt, chromium, tantalum, platinum, niobium, or palladium layer above and in contact with the top heavily doped n-type region, wherein the silicide, germanide, or silicide-germanide is formed when a portion of the titanium, cobalt, chromium, tantalum, platinum, niobium, or palladium layer reacts with the top heavily doped n-type region.

8. The method of claim 7 wherein the titanium, cobalt, chromium, tantalum, platinum, niobium, or palladium layer is a portion of a top conductor.

9. The method of claim 7 wherein the titanium, cobalt, chromium, tantalum, platinum, niobium, or palladium layer is a portion of a hard mask used to etch the pillar during the patterning and etching step.

10. The method of claim 1 wherein the p-i-n diode is a portion of a memory cell, wherein the memory cell further comprises:
    a portion of the first rail-shaped conductor;
    a portion of a second rail-shaped conductor above the p-i-n diode, the p-i-n diode disposed between the first rail-shaped conductor and the second rail-shaped conductor.

11. The method of claim 10 wherein the memory cell further comprises a dielectric rupture antifuse, the dielectric rupture antifuse and the p-i-n diode arranged electrically in series between the first conductor and the second conductor.

12. The method of claim 11 wherein the dielectric rupture antifuse comprises $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, or $ZrSiAlON$.

13. The method of claim 11 wherein the dielectric rupture antifuse comprises silicon dioxide.

14. The method of claim 10 wherein the memory cell further comprises a resistivity-switching element, the resistivity-switching element and the p-i-n diode arranged electrically in series between the first conductor and the second conductor.

15. The method of claim 14 wherein the resistivity-switching element comprises a binary metal oxide.

16. The method of claim 15 wherein the binary metal oxide is selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

17. The method of claim 14 wherein the resistivity-switching element comprises carbon nanotube fabric.

18. The method of claim 1 wherein the substrate is a monocrystalline silicon wafer.

19. A method for forming a monolithic three dimensional memory array, the method comprising:
    a) monolithically forming a first memory level above a substrate by:
    i) forming a first plurality of rail-shaped conductors above the substrate;
    forming a plurality of p-i-n diodes by:
    (a) forming a bottom heavily doped p-type region of deposited semiconductor material above the first rail-shaped conductors;

(b) forming a middle intrinsic or lightly doped region of deposited semiconductor material above the bottom heavily doped p-type semiconductor, wherein the middle intrinsic or lightly doped region of deposited semiconductor material is silicon, germanium, or a silicon-germanium alloy;

(c) patterning and etching the bottom heavily doped p-type region and the middle intrinsic or lightly doped region to form a first plurality of pillars;

(d) forming a top heavily doped n-type region of deposited semiconductor material by doping with arsenic;

ii) forming a silicide-forming metal region in contact with the top heavily doped n-type region of the p-i-n diodes;

iii) forming a silicide, germanide, or silicide-germanide by reacting the silicide-forming metal region with the top heavily doped n-type region of the p-i-n diodes;

iv) annealing to crystallize the deposited semiconductor material, where some portion of the deposited semiconductor material was amorphous as deposited and is in contact with the silicide, germanide, or silicide-germanide before the annealing step; and v) forming a second plurality of rail-shaped conductors above the middle intrinsic or lightly doped region, wherein the first memory level comprises a first plurality of memory cells, each first memory cell comprising a portion of one of the first rail-shaped conductors, one of a first plurality of pillars, and a portion of one of the second conductors, b) monolithically forming a second memory level above the first memory level.

20. The method of claim 19 wherein the second memory level comprises a second plurality of p-i-n diodes, each second p-i-n diode comprising a portion of a second bottom heavily doped n-type region, a portion of a second middle intrinsic or lightly doped region, and a portion of a second top heavily doped p-type region.

21. The method of claim 20 wherein the second conductors are shared by the first memory level and the second memory level.

* * * * *